United States Patent

Hull et al.

[11] Patent Number: 5,805,507
[45] Date of Patent: Sep. 8, 1998

[54] VOLTAGE REFERENCE GENERATOR FOR EPROM MEMORY ARRAY

[75] Inventors: Richard Hull, Chandler; Randy L. Yach, Phoenix, both of Ariz.

[73] Assignee: Microchip Technology Incorporated, Chandler, Ariz.

[21] Appl. No.: 723,924

[22] Filed: Oct. 1, 1996

[51] Int. Cl.⁶ .................................................. G11C 7/00
[52] U.S. Cl. ........................... 365/189.09; 365/189.06; 365/185.2
[58] Field of Search ................... 365/189.09, 189.06, 365/189.11, 185.23, 185.2, 226; 395/750

[56] References Cited

U.S. PATENT DOCUMENTS

| | | | |
|---|---|---|---|
| 4,460,985 | 7/1984 | Hoffman | 365/207.07 |
| 5,027,320 | 6/1991 | Pathak et al. | 365/185.23 |
| 5,132,936 | 7/1992 | Keswick et al. | 365/189.06 |
| 5,253,204 | 10/1993 | Hatakeyama et al. | 365/189.06 |
| 5,268,871 | 12/1993 | Dhong et al. | 365/189.09 |
| 5,291,446 | 3/1994 | Van Buskirk et al. | 365/189.09 |
| 5,373,479 | 12/1994 | Sugibayashi | 365/189.09 |
| 5,388,084 | 2/1995 | Itoh et al. | 365/189.09 |
| 5,453,953 | 9/1995 | Dhong et al. | 365/189.09 |
| 5,463,583 | 10/1995 | Takashina | 365/189.06 |

*Primary Examiner*—Tan T. Nguyen
*Attorney, Agent, or Firm*—Blank Rome Comisky & McCauley, LLP

[57] ABSTRACT

A technique is disclosed for reading a memory element of an EPROM array embedded in a microcontroller chip which has been scaled down from a previous design by virtue of reduced line widths of a process technology used for fabricating the chip. The microcontroller chip has a predetermined supply voltage, and the array comprises rows and columns of addressable memory elements which may be selectively accessed to read data content therefrom in a low voltage mode in which the supply voltage initially rises and ultimately reaches substantially its maximum voltage during a read cycle. A regulated reference voltage is used to exercise row and column control in the low voltage read mode by tracking the level of the supply voltage up to a certain preselected level below the maximum supply voltage, and by clamping the row and column control voltage at substantially the preselected level despite increases in the level of the supply voltage above the preselected level.

9 Claims, 2 Drawing Sheets

VOLTAGE REFERENCE GENERATOR FOR EPROM MEMORY ARRAY

CROSS-REFERENCE TO RELATED APPLICATIONS

This application is related to co-pending applications titled "Switched Ground Read for EPROM Memory Array" (Attorney's Docket No. 1305.086), "High Voltage Level Shifting CMOS Buffer" (Attorney's Docket No. 1305.089), and "Overcharge/Discharge Voltage Regulator for EPROM Memory Array" (Attorney's Docket No. 1305.090), filed on the same day and assigned to the same assignee as this application, and the disclosures of which are incorporated herein by reference.

BACKGROUND OF THE INVENTION

The present invention relates generally to read-only memory devices and memory arrays, and to improved techniques and devices for reading data from such devices and arrays, and more particularly to improved structures and methods for reading data from erasable programmable read-only memory (EPROM) devices.

EPROM devices are fabricated using semiconductor process technology. As line widths are reduced in progression of the process technology it may be desirable not only to design and fabricate entirely new versions of products but to "shrink" or scale existing products to a smaller size with the new technology. This requires review and analysis of the design and architecture of the product and the manner in which the attempted scaling of its size may adversely affect its operation. The present invention arose from the task to shrink EPROM products according to a new process technology, in a cost-effective and operation-feasible manner.

In undertaking such a task for an EPROM program memory embedded in a microcontroller, for example, the scaling process imposes restrictions which, when coupled with the device requirements, makes the task extremely difficult. Some of the issues encountered in implementing a scaling process for such a device are wide voltage range, low program read margins, high speed, and low current. In particular, the read margins of the scaled EPROM are typically lower than the operating voltage range of the device.

In a classic implementation of an EPROM array embedded in a microcontroller, the supply voltage of the microcontroller is used to control the EPROM memory element so as to enable reading of the data stored in the element. To read the data, a measurement of the programmed threshold voltage of the memory element is required. The memory element is said to be erased if the threshold voltage of the EPROM cell is low, and to be programmed if the threshold voltage is high. The cell is read by applying a voltage to the control gate of a transistor comprising the cell. If the applied voltage is higher than the threshold, current flows through the cell. The programming margin of the cell is the voltage difference between the maximum applied control gate voltage and the programmed threshold voltage of the programmed cell. A programmed EPROM cell will not conduct current when read by application of a control gate voltage of lower magnitude than the high threshold voltage of the cell.

In most implementations, the control gate voltage used to read the memory array is the supply voltage of the system. If the programmed threshold of the memory cell is lower than the maximum value of that supply voltage, a programmed cell cannot be detected using the classic techniques.

Scaling the device to smaller size also has the effect of reducing the voltage range which is used to operate the EPROM. When an EPROM memory cell is shrunk, the programmed threshold voltage is decreased and the effective programming margin is lowered. Also, a smaller EPROM cell typically dictates a lower read current. All of this makes it difficult to read the data in a scaled EPROM cell by means of standard techniques.

Lowering the read margin voltage below the supply voltage requires that the row voltage (i.e., the voltage that controls the gate of the EPROM memory element) be regulated to a lower value. If the control gate voltage is not reduced to a level below the magnitude of the programmed threshold voltage, the contents of the EPROM memory cell cannot be read. Regulating the read voltage usually requires the consumption of significant amounts of current, especially if the electrical node being driven requires high speed operation or is heavily loaded with capacitance.

A typical solution to regulate the row voltage would be to clamp the row voltage by bleeding off current proportional to the supply voltage to limit the final voltage that is applied to the EPROM element. In the classic EPROM read architecture, the row drive circuitry is also required to be high speed and has a significant amount of capacitive loading. This makes the job of regulating the final voltage very difficult when given the constraints of low current consumption and high speed operation.

The imposition of a requirement of high voltage to program the EPROM array may be unavoidable. In at least one prior art product, a separate set of transistors is required which is suitable for high voltage to accommodate the X-decoder, Y-decoder, and sense amplifier. But problems arise in that the prior designs do not allow cost-effective scaling of the technology; and if special transistors suitable for handling high voltage are needed, they create circuit complexity and add significantly to the cost of the device.

It is therefore a principal aim of the present invention to provide an improved technique for handling the high voltage problem in the low voltage mode operation of an EPROM device.

SUMMARY OF THE INVENTION

According to the invention, the supply voltage $V_{DD}$ for the EPROM is considered relative to voltage reference $V_{REF}$, in the low voltage mode. Read margins are acceptable at low voltage with a minimum voltage level at 4.5 volts (v), for example, so all of $V_{DD}$ (e.g., 6.0 v) is used to accommodate the desired high speed of the device. This is achieved by having $V_{REF}$ track $V_{DD}$ at low voltage. This is intended to correct any low voltage problem, but leaves the high voltage problem to be addressed. In the context of the present invention, it should be emphasized that the references herein to "low voltage" and "high voltage" or to "lower or higher" supply voltage are intended to pertain to relative levels of the supply voltage in the "low voltage mode" of the EPROM. The operation addressed by the invention is in the low voltage mode only, which means not during programming (i.e., not during or not in the "high voltage mode" of the EPROM).

When the circuit is initially energized, as all voltages begin to rise to the operating levels, $V_{REF}$ tracks $V_{DD}$ until a predetermined voltage level is reached which is less than the current full voltage level of $V_{DD}$. By way of example, a suitable voltage for $V_{REF}$ at that point may be approximately 3 v, for a $V_{DD}$ of about 4.5 v. $V_{REF}$ is then clamped at that voltage level. After setting this clamp voltage, the row (X)

word line is referenced one threshold above the clamp voltage, and the column (Y) line is referenced one threshold below the clamp voltage.

By causing the reference voltage source to track $V_{DD}$ throughout at low voltage, but to be clamped at a set level below the full range of the supply voltage for high voltage, the device operates in a range from low voltage to high voltage (again, all of this being in the low voltage mode). In other words, a clamp circuit controls the $V_{REF}$ voltage depending on whether the supply voltage is lower or higher in the low voltage mode. And the circuit need only use standard transistors to operate at the lower and higher levels of supply voltage in that mode.

Accordingly, a more specific object of the present invention is to provide an improved voltage reference generator for an EPROM memory array, in which a clamp circuit controls the reference voltage depending on the relative level of the supply voltage in the low voltage mode of the EPROM.

BRIEF DESCRIPTION OF THE DRAWINGS

The above and still further aims, objects, features, aspects, and attendant advantages of the invention will become apparent from a consideration of the best mode presently contemplated for practicing the invention, as implemented in a preferred embodiment and method, taken in conjunction with the accompanying drawings, in which.

DETAILED DESCRIPTION OF THE
PREFERRED EMBODIMENT AND METHOD

Figure 1:
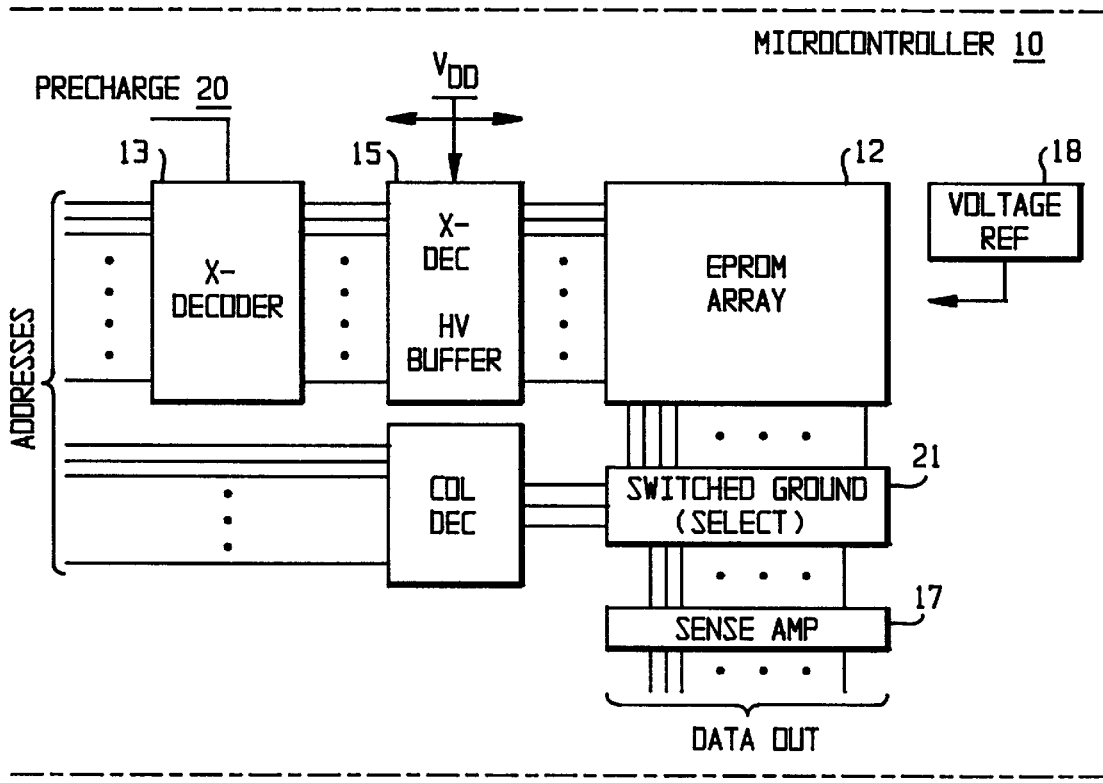
FIG. 1 is a circuit diagram of an exemplary EPROM array circuit embedded in a microcontroller device, in which the present invention is used.

An example of an applicable portion of an EPROM device embedded in a microcontroller in which the present invention is embodied is illustrated in the circuit diagram of FIG. 1. Portions of the circuit of particular interest include an X-decoder 13, X-decoder high voltage level shifting complementary metal-oxide-silicon (CMOS) buffer 15, voltage reference 18, row precharge 20, sense amplifier 17, switched ground 21, all associated with the EPROM device, and a row clamp to be addressed in the discussion of the subsequent Figures.

An EPROM array 12 is embedded as a program memory in a microcontroller 10. The memory array is composed of the usual rows and columns in which the state of a transistor (i.e., presence or absence of a device) at the intersection of any given row and column represents the value ("0" or "1") of the bit stored at that array location. The standard supply voltage $V_{DD}$ of the microcontroller is used to control the EPROM memory element so as to read the data stored in the memory element. X-decoder 13, which is essentially the row driver circuit for EPROM array 12, generates the control gate voltage and the control programming voltage for the array in the low voltage mode of operation. X-decoder high voltage level shifting CMOS buffer 15 is coupled to the supply voltage $V_{DD}$ to translate that voltage to a high voltage to program the EPROM memory element in the high voltage mode of operation, and is also used in conjunction with sense amplifier 17 for the array.

Voltage reference 18 is employed to limit the read voltage of the control gate and the drain of the EPROM memory element. A row precharge circuit is typically used with an EPROM to improve the time in which array locations are accessed to read data, or to reduce DC power dissipation, or both. Here, the row precharge 20 is done in the regulator circuit and is passed on to X-decoder 13 to drive the control gate. Sense amplifier 17 senses the current in the memory element, and determines the threshold of the EPROM element.

A switched ground circuit 21 is used to further speed up the access time of the EPROM array. The premise for this circuit is that current will flow in the memory element only if the control gate of the element is high, the drain of the element is connected to the sense amplifier, and the source of the element is connected to ground. During the setup of the row voltage, the source is disconnected from ground until the voltage has reached a predetermined proper value. At that point, the source is grounded and current flows to read the memory element.

Figure 2:
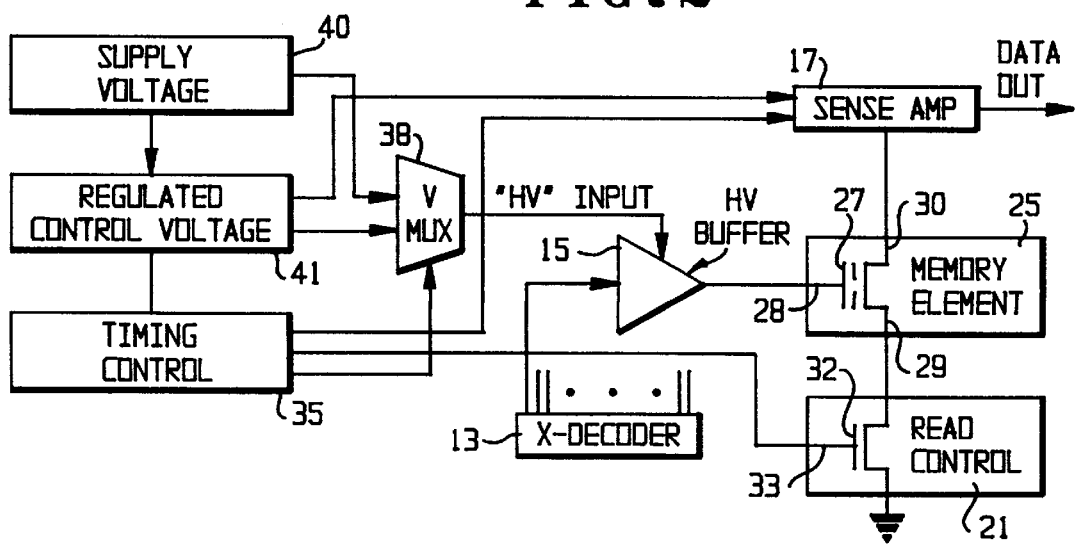
FIG. 2 is a circuit diagram illustrating the read circuit for a memory cell of EPROM array of FIG. 1.

In the circuit diagram of FIG. 2, memory element 25 of the array 12 comprises an MOS transistor 27 having a control gate 28, a source electrode 29, and a drain electrode 30. The drain electrode is connected to sense amplifier 17 which provides the data output from a read of the memory element 25. Initially, the control gate 33 of a switching transistor 32 in a read control circuit constituting a switched ground circuit 21 receives a control gate voltage during a first clock period from a timing control circuit 35 to which gate 33 is coupled. The level of the control gate voltage is predetermined to cause transistor 32 to be switched off, thereby disconnecting source electrode 29 of transistor 27 from ground.

During that first clock period, the timing control 35 delivers a signal to a voltage multiplexer (VMUX) 38, which receives dual inputs from the standard supply voltage 40 (i.e., $V_{DD}$) and a regulated control voltage 41, to connect the supply voltage to the control gate 28 of memory element 25. The output of VMUX 38 is coupled as a high voltage input to buffer 15, and the output of the buffer is applied to control gate 28. As a consequence, the memory element is quickly pre-charged to a level substantially equal to the supply voltage, which may be above the programmed threshold of the memory element. Timing control 35 then delivers a switching signal to VMUX 38 to remove the supply voltage from the control gate of memory element 25 and replace it with the lower regulated control voltage 41, so that the row control voltage of the memory element is discharged to a value lower than the EPROM programmed threshold voltage.

The timing control then switches on transistor 32 of switched ground circuit 21 by application of an appropriate voltage to its control gate 33 during the very next clock period. As a result, the source electrode 29 of transistor 27 is now connected to ground so that current flows through the source-drain path of memory element 25, which enables the element to be read. To that end, the timing control also activates sense amplifier 17 to provide a data readout.

Figure 3:
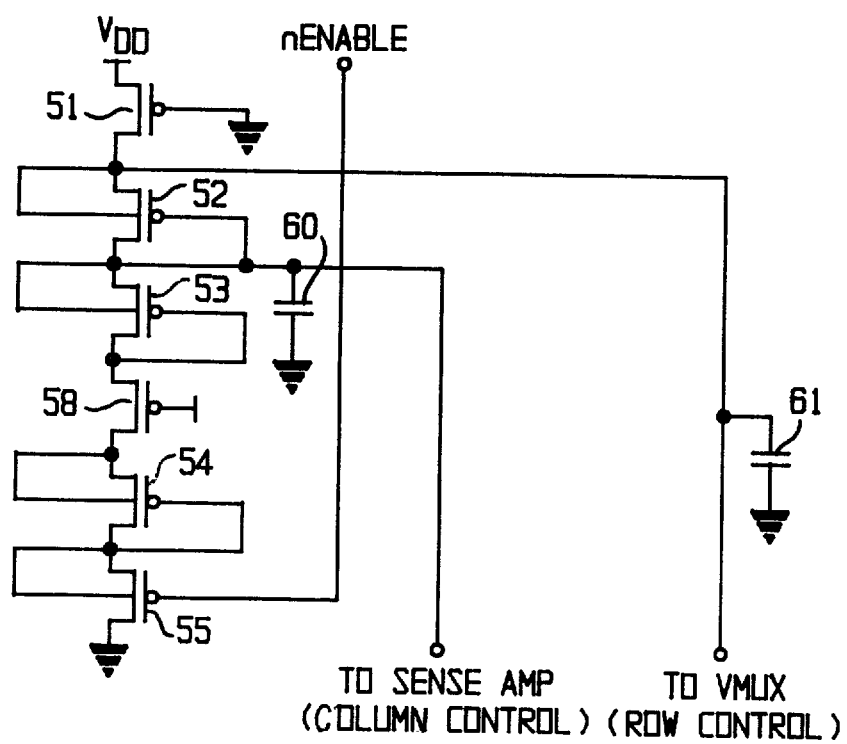
FIG. 3 is a voltage reference generator according to the present invention, used in the EPROM array of FIGS. 1 and 2.

Referring now to FIG. 3, the improved voltage reference of the present invention, illustrated as the regulated control voltage circuit 41 of FIG. 2, comprises a plurality of PMOS transistors 51, 52, 53, 54, and 55, and an NMOS transistor 58. Transistor 51 is selected to have a current carrying capability significantly lower than that of the other transistors, so that as $V_{DD}$ rises, the voltage at the drain electrode of transistor 51 ultimately reaches a level which is sufficient to turn on all of the other transistors. The voltage at that node then becomes a constant, regardless of an increasing magnitude of $V_{DD}$ above that level. The circuit generates low variance analog levels without the presence of switching circuits that could draw DC current of significant magnitude. Capacitors 60 and 61 are used to stabilize the analog voltages.

In this way, the voltage reference generator output $V_{REF}$ tracks the supply voltage $V_{DD}$ at low voltage levels during operation in the low voltage (non-programming) mode. And when $V_{DD}$ reaches the predetermined voltage level at which transistor 51 is turned on, which is less than the highest magnitude of $V_{DD}$, $V_{REF}$ is clamped at that voltage level. After the clamp voltage is set, the voltage applied to VMUX 38 for row control is slightly above the clamp voltage, and the voltage applied to the sense amplifier 17 for column control is slightly below the clamp voltage, by virtue of the different electrical connections of the row control and column control output paths to the transistor string of the circuit of FIG. 3. As $V_{DD}$ continues to rise to its full voltage, the voltages applied to the VMUX and the sense amplifier remain constant at thresholds respectively above and below the clamp voltage level. In essence, the clamp circuit controls $V_{REF}$ to track the supply voltage at levels below the predetermined clamp voltage level, and to remain at the clamp voltage level despite subsequent increases in the supply voltage above that level.

The effect is that of quickly pre-charging a capacitor, then discharging it slightly to a lower level, and then reading the EPROM memory cell. The difference $\Delta V$ in voltage levels during this operation is relatively small, and consequently very little current is drawn in contrast to prior art slow speed designs in which a traditional DC reference draws DC current at all times. In the circuit of FIG. 2, an AC dynamic current is present, but the EPROM device operates at considerably higher speed, much higher current can be drawn, and the average current level is small. The sense amplifier for the column decoder performs tracking at very low current (e.g., 500 nanoamps).

The X-decoder of the EPROM array is fed by the regulated reference voltage source, and when the X-decoder is being read, the source clamps the voltage on the word line to a relatively low value not exceeding the program threshold, and with virtually no current dissipation. The same reference voltage source is applied to the Y-decoder of the circuit to limit the column voltage. In this way, both row and column voltages are limited to assure operation at the appropriate point set by the device implementation. Everything in this portion of the circuit is pre-charged, and turned on, except for ground (i.e., the switched ground circuit is off), and all voltages are brought up to full scale.

The accessed cell may then be read at high speed by virtue of the ground side or ground plane of the memory array being connected to the cell via the switched ground circuit. The row is driven all the way to $V_{DD}$ in one clock period, is clamped at a predetermined lower voltage in the next period, and the memory cell is grounded through the switched ground circuit to enable a readout of the cell. The actual speed path for this architecture is only the time required to ground the source electrode combined with the time required to trip the sense amplifier.

The circuit design accommodates the need to read the EPROM memory element at very low threshold voltage without drawing substantial current in the sense amplifier. In contrast, for example, a comparator-type sense amplifier would suffer a current penalty. While the invention arose from design considerations flowing from a need to shrink a current product in contemplation of a scaling of the process technology, the invention is not limited to such considerations.

Although a presently contemplated best mode of practicing the invention has been described herein, it will be understood by those skilled in the art to which the invention pertains, from a consideration of the foregoing description, that variations and modifications of the preferred embodiment and method of the invention may be made without departing from the true spirit and scope of the invention. Accordingly, it is intended that the invention shall be limited only to the extent required by the appended claims and the rules and principles of the applicable case law.

What is claimed is:

1. An erasable programmable read-only memory (EPROM) having a memory array in which rows and columns of the array are used to program data to be stored and to read data stored in the array as 0's and 1's according to the presence or absence of a device at each intersection of a row and a column of the array, the EPROM comprising:
    row control means adapted, when energized, for controlling a row of the array,
    column control means adapted, when energized, for controlling a column of the array,
    a source of supply voltage, and
    reference voltage source means for energizing each of the row control means and the column control means, said reference voltage source means including means for tracking the supply voltage as the energizing voltage at values below a predetermined voltage level, and for clamping the energizing voltage substantially at said predetermined voltage level despite further increases in the value of the supply voltage to higher levels.

2. The EPROM of claim 1, further including means for setting the energizing voltage for row control at a level slightly above said predetermined voltage level and for setting the energizing voltage for column control at a level slightly below said predetermined voltage level, at the higher levels of the supply voltage.

3. The EPROM of claim 2, wherein:
    said means for tracking and clamping includes a string of MOS transistors, a lead one of which is selected to have a current carrying capacity significantly lower than that of the other transistors of the string, whereby to turn on the other transistors of the string at said predetermined voltage level, and
    said means for setting includes selected circuit paths to different points of the transistor string for electrical connections to the row control means and the column control means.

4. A method of operating an erasable programmable read-only memory (EPROM) having a memory array in which rows and columns of the array are used to program data to be stored and to read data stored in the array, in a low voltage read mode, the method comprising the steps of:
    supplying a regulated version of a source of supply voltage for the EPROM to provide row and column control in the low voltage read mode;
    increasing the supply voltage and tracking the increase with the regulated version voltage at relatively low voltage levels of the supply voltage in a read cycle until the supply voltage reaches a prescribed level below the maximum value thereof, and
    thereupon clamping the regulated version voltage at said prescribed level to read a cell of the array selected by exercise of the row and column control in the read cycle, whereby to reduce read time of the EPROM and EPROM circuit complexity.

5. A method of operating an erasable programmable read-only memory (EPROM) having a memory array in which rows and columns of the array are used to program data to be stored and to read data stored in the array, in a low voltage read mode, the method comprising the steps of:

supplying a regulated version of a source of supply voltage for the EPROM to provide row and column control in the low voltage read mode: and tracking the supply voltage as the regulated version at relatively low voltage levels of the supply voltage in a read cycle, and clamping the voltage at a prescribed level below the maximum value of the supply voltage as the regulated version at relatively higher voltage levels of the supply voltage in the read cycle, whereby to improve the EPROM speed and reduce circuit complexity, and further including setting the regulated version of the voltage for row control at a level slightly above said prescribed level and setting the regulated version of the voltage for column control at a level slightly below said prescribed level, at the relatively higher levels of the supply voltage during the read cycle.

6. An EPROM having an array of rows and columns for storing and reading data, comprising:

a supply voltage source, a reference voltage source adapted to track an increasing level of the supply voltage during a read cycle of the EPROM, means for activating control of row and column lines from the reference voltage source as the level of the supply voltage increases up to a predetermined level below the maximum level of the supply voltage to access a selected EPROM cell during the read cycle of the EPROM, and means for clamping row and column control at a voltage level substantially equal to said predetermined level when said supply voltage increases above said predetermined level during the read cycle.

7. An EPROM having an array of rows and columns for storing and reading data comprising:

a supply voltage source, means for activating control of row and column lines from the supply voltage source as the level of the supply voltage increases up to a predetermined level below the maximum level of the supply voltage to access a selected EPROM cell during a read cycle of the EPROM, means for reducing and limiting row and column control to a voltage level substantially equal to said predetermined level when said supply voltage increases above said predetermined level during the read cycle, and means for setting the row control voltage at a threshold level above said predetermined level and for setting the column control voltage at a threshold level below said predetermined level, when the supply voltage increases above said predetermined level.

8. A microcontroller with an on-chip program memory for storing programs for execution by the microcontroller in response to instructions, to control an aspect of the operation of an external system, a source of supply voltage for the microcontroller, said program memory including an array of rows and columns for storing and reading data and further including an improvement comprising:

means for activating row and column control from a reference voltage having a level that tracks the level of said supply voltage during a read cycle of the program memory as the level of said supply voltage increases to a predetermined level below the maximum level of the supply voltage, and means for clamping row and column control at a voltage level substantially equal to said predetermined level despite increase of said supply voltage beyond said predetermined level during the read cycle.

9. A microcontroller with an on-chip program memory for storing programs for execution by the microcontroller in response to instructions, to control an aspect of the operation of an external system, a source of supply voltage for the microcontroller, said program memory including an array of rows and columns for storing and reading data and further including an improvement comprising:

means for activating row and column control from said source of supply voltage during a read cycle of the program memory as the level of said supply voltage increases to a predetermined level below the maximum level of the supply voltage, and means for reducing the voltage level and then clamping and column control at a voltage level substantially equal to said predetermined level despite increase of said supply voltage beyond said predetermined level during the read cycle, and wherein said program memory improvement further includes:

means for setting row control voltage at a threshold level above said predetermined level and for setting column control voltage at a threshold level below said predetermined level, when the supply voltage increases beyond said predetermined level during the read cycle of the memory.

* * * * *